(12) United States Patent
Atake et al.

(10) Patent No.: US 12,239,220 B2
(45) Date of Patent: Mar. 4, 2025

(54) STORAGE RACK FOR STORING CONTAINERS

(71) Applicant: MURATA MACHINERY, LTD., Kyoto (JP)

(72) Inventors: Hidekazu Atake, Ise (JP); Hiroyuki Yokoyama, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 0 days.

(21) Appl. No.: 18/285,884

(22) PCT Filed: Mar. 1, 2022

(86) PCT No.: PCT/JP2022/008692
§ 371 (c)(1),
(2) Date: Oct. 6, 2023

(87) PCT Pub. No.: WO2022/219949
PCT Pub. Date: Oct. 20, 2022

(65) Prior Publication Data
US 2024/0180325 A1 Jun. 6, 2024

(30) Foreign Application Priority Data

Apr. 14, 2021 (JP) ................................. 2021-068495

(51) Int. Cl.
*A47B 57/40* (2006.01)
*A47B 51/00* (2006.01)

(52) U.S. Cl.
CPC .............. *A47B 57/40* (2013.01); *A47B 51/00* (2013.01)

(58) Field of Classification Search
CPC ... A47B 57/40; A47B 51/00; A47B 2051/005; A47B 43/006; A47B 63/06; A47B 63/067
USPC ................ 211/209, 1.51, 208, 1.52; 108/20; 414/608
See application file for complete search history.

(56) References Cited

U.S. PATENT DOCUMENTS

| 322,330 | A | * | 7/1885 | Bogart, Jr. et al. | A43D 117/00 |
| | | | | | 211/209 |
| 527,870 | A | * | 10/1894 | Meslein | A43D 117/00 |
| | | | | | 211/198 |
| 1,602,771 | A | * | 10/1926 | James | A47B 43/006 |
| | | | | | 211/10 |
| 1,816,705 | A | * | 7/1931 | Arthur | A47B 43/006 |
| | | | | | 108/1 |
| 2,614,704 | A | * | 10/1952 | Winslow | B66C 1/12 |
| | | | | | 211/209 |

(Continued)

FOREIGN PATENT DOCUMENTS

| JP | 2004-256218 A | 9/2004 |
| JP | 2008024417 A | 2/2008 |

OTHER PUBLICATIONS

Official Communication issued in International Patent Application No. PCT/US2022/08692, mailed on May 24, 2022.

(Continued)

*Primary Examiner* — Jennifer E. Novosad
(74) *Attorney, Agent, or Firm* — Keating & Bennett, LLP

(57) ABSTRACT

A storage rack includes a base frame and a shelf movable upward with respect to the base frame. A hoist is attachable to and detachable from the base frame and placeable on the base frame. The shelf includes an engaged portion engageable with a hook of the hoist.

2 Claims, 13 Drawing Sheets

(56) References Cited

U.S. PATENT DOCUMENTS

| | | | | |
|---|---|---|---|---|
| 3,252,584 | A * | 5/1966 | Strout | A43D 117/00 |
| | | | | 211/209 |
| 3,329,284 | A * | 7/1967 | Bogart, Jr. | B66C 19/005 |
| | | | | 212/323 |
| 3,330,419 | A * | 7/1967 | Henry | A47B 51/00 |
| | | | | 211/208 |
| 3,467,460 | A * | 9/1969 | Acker | A47B 61/02 |
| | | | | 5/10.1 |
| 3,612,304 | A * | 10/1971 | Troth | B65G 1/0428 |
| | | | | 414/284 |
| 3,718,267 | A * | 2/1973 | Hiebert | B65G 57/03 |
| | | | | 198/817 |
| 3,851,764 | A * | 12/1974 | Anders | A47B 63/067 |
| | | | | 211/121 |
| 4,345,802 | A * | 8/1982 | Sorensen | A47J 39/025 |
| | | | | 220/8 |
| 4,650,264 | A * | 3/1987 | Dahnert | G05B 19/23 |
| | | | | 198/794 |
| 5,074,745 | A * | 12/1991 | Neri | B65B 41/00 |
| | | | | 414/795.8 |
| 5,195,426 | A * | 3/1993 | Thuli | A01J 25/167 |
| | | | | 99/452 |
| 5,328,322 | A * | 7/1994 | Neri | B65G 61/00 |
| | | | | 414/796.9 |
| 6,045,324 | A * | 4/2000 | Redman | B65G 59/063 |
| | | | | 414/788.9 |
| 6,241,048 | B1 * | 6/2001 | Heilmann | B66F 7/02 |
| | | | | 254/311 |
| 7,287,872 | B2 * | 10/2007 | Kubota | A47B 43/006 |
| | | | | 362/418 |
| 7,290,777 | B2 * | 11/2007 | Preston | B62B 3/10 |
| | | | | 414/679 |
| 9,048,275 | B2 * | 6/2015 | Murata | H01L 21/67379 |
| 10,874,209 | B1 * | 12/2020 | Dunseath | A47B 57/06 |
| 11,771,220 | B1 * | 10/2023 | Brooks | A47B 51/00 |
| | | | | 312/319.7 |
| 11,877,654 | B1 * | 1/2024 | Cain | B25H 3/06 |
| 2006/0086565 | A1 * | 4/2006 | Hernandez | B25H 1/16 |
| | | | | 182/1 |
| 2006/0238085 | A1 * | 10/2006 | Greenberg | A47B 51/00 |
| | | | | 312/306 |
| 2007/0176524 | A1 * | 8/2007 | Plano | A47B 77/04 |
| | | | | 312/247 |
| 2008/0156760 | A1 * | 7/2008 | Maetaki | B65G 37/02 |
| | | | | 212/71 |
| 2008/0168920 | A1 | 7/2008 | Nakashima et al. | |
| 2012/0248046 | A1 * | 10/2012 | Warner | A47B 51/00 |
| | | | | 211/1.57 |
| 2014/0252930 | A1 * | 9/2014 | Reid | A47B 46/005 |
| | | | | 312/247 |
| 2016/0278517 | A1 * | 9/2016 | DeLorean | F24F 7/007 |
| 2019/0329981 | A1 | 10/2019 | Kilibarda et al. | |
| 2022/0183460 | A1 * | 6/2022 | Aghaei | A47B 46/005 |
| 2023/0061872 | A1 * | 3/2023 | Kim | B65G 1/0478 |
| 2023/0249908 | A1 * | 8/2023 | Steinberg | B65G 1/026 |
| | | | | 211/209 |
| 2024/0065182 | A1 * | 2/2024 | Hall | A01G 9/246 |
| 2024/0180325 | A1 * | 6/2024 | Atake | B65G 1/14 |

OTHER PUBLICATIONS

Official Communication issued in International Patent Application No. PCT/JP2022/008692, mailed on Oct. 26, 2023.

English translation of Official Communication issued in International Patent Application No. PCT/JP2022/008692, mailed on May 24, 2022.

* cited by examiner

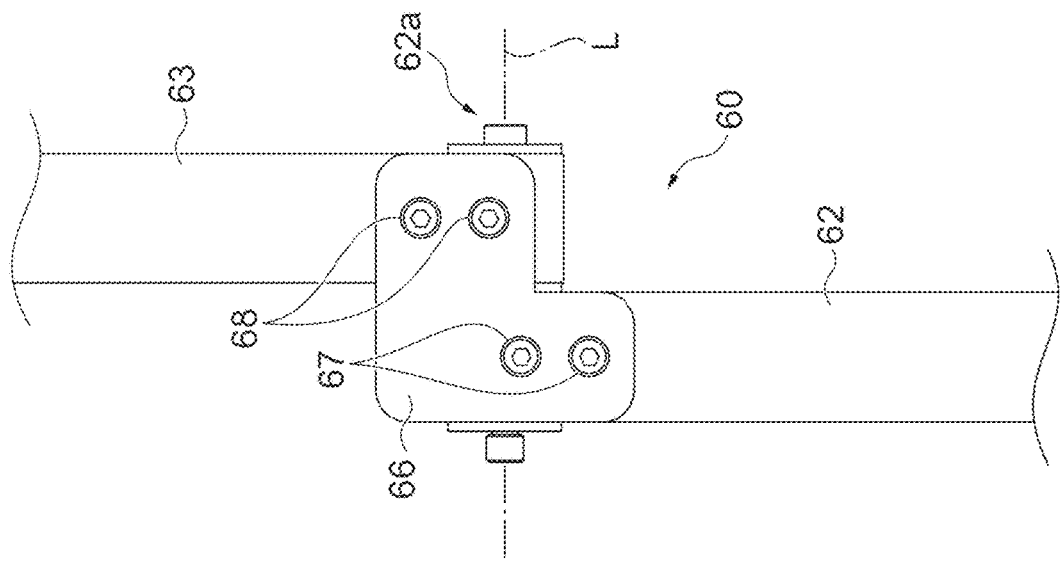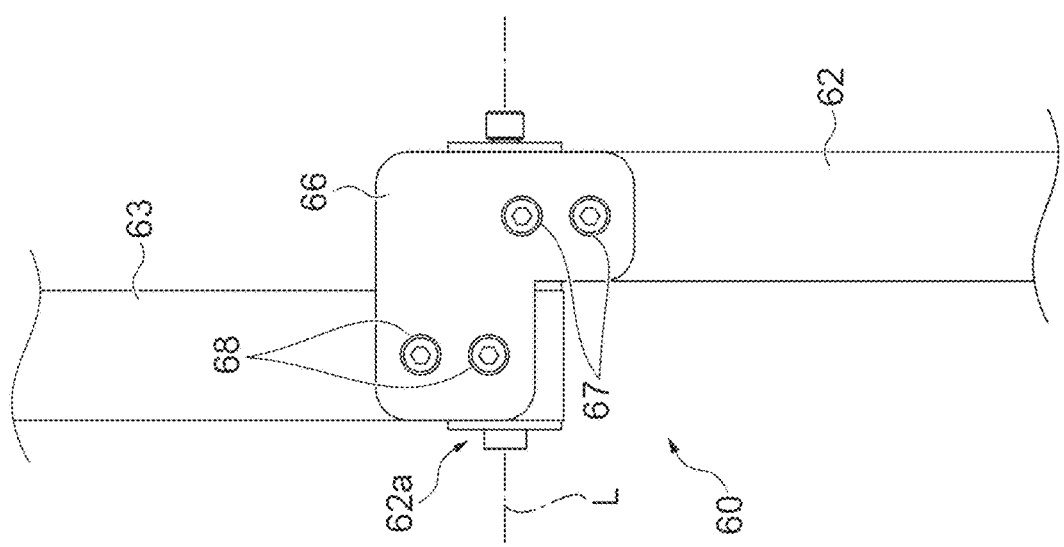
Fig.8

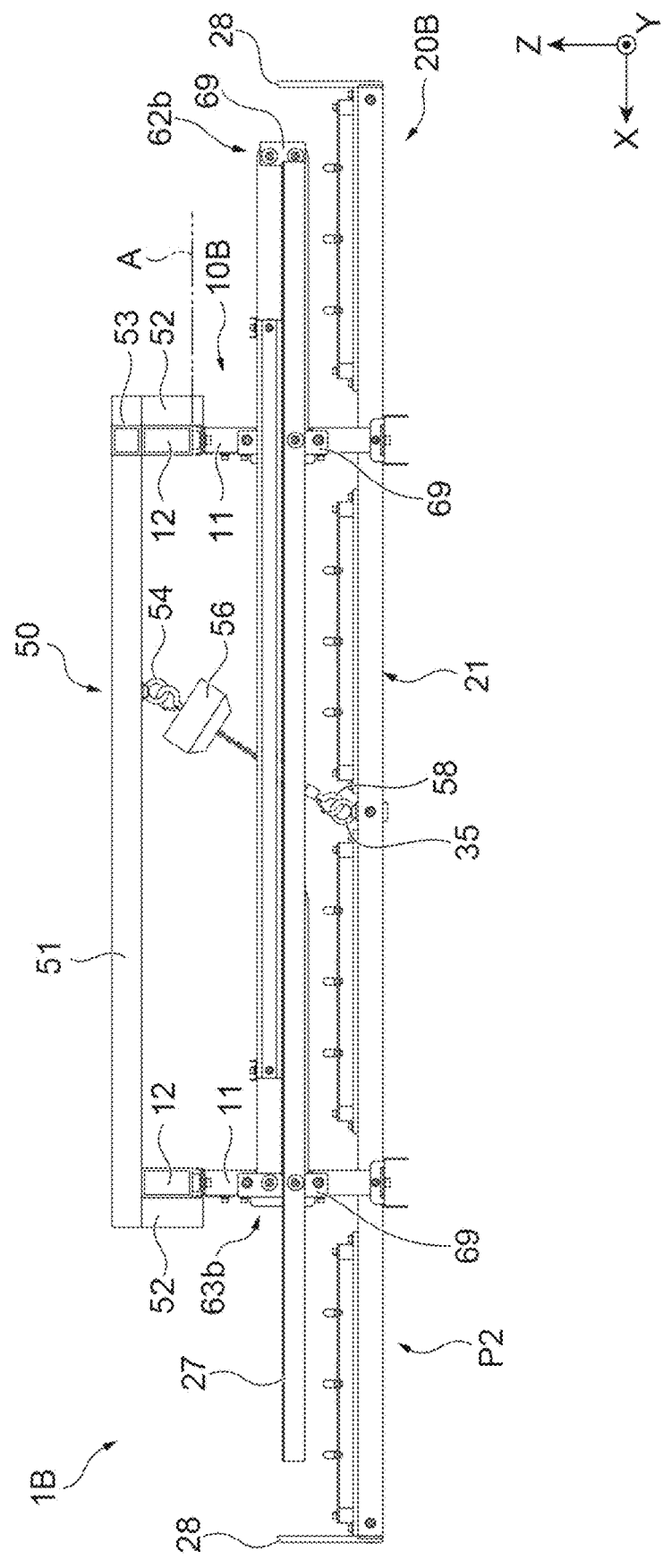

STORAGE RACK FOR STORING CONTAINERS

BACKGROUND OF THE INVENTION

1. Field of the Invention

The present disclosure relates to a storage rack configured to store containers.

2. Description of the Related Art

As a conventional storage rack configured to store containers, a technique is known in which a constant-tension spring is wound by a winding unit to fold posts and retract a buffer from a storage position.

SUMMARY OF THE INVENTION

In the conventional storage rack described above, the winding unit configured to move the buffer (shelf) upward is fixed to an upper frame. In other words, when the shelf is provided in a plurality, the winding unit is provided to each shelf. In this configuration, the entire storage rack tends to be larger. In addition, in the configuration in which the posts are folded inward from each other, it may be difficult to actually fold the posts well. Another means is needed to easily retract the shelf upward.

Preferred embodiments of the present disclosure provide storage racks that each allow a shelf to be easily retracted upward.

An aspect of a preferred embodiment of the present disclosure is a storage rack including a base frame and a shelf movable upward with respect to the base frame, a hoist attachable to and detachable from the base frame and placeable on the base frame, and the shelf includes an engaged portion engageable with a hook of the hoist.

With this storage rack, the shelf can be moved upward by placing the hoist, which is prepared separately from the storage rack, on the base frame and engaging the engaged portion with the hook and hoisting the shelf. The storage rack does not include the hoist, and thus the configuration thereof can be simplified more than a conventional one. A hoisting operation (retracting operation) itself is also simple, and thus the shelf can be easily retracted upward.

The base frame may include transverse beams horizontally spaced apart and each including a placement surface on which the hoist is to be placed. With this configuration, preparation for hoisting is completed simply by placing the hoist on the placement surfaces of the transverse beams and engaging the engaged portion with the hook, and thus the hoisting operation is further facilitated.

The shelf may include a support column extending in a vertical direction, the support column may include a stopper at an upper end thereof, the base frame may include a guide portion in which an insertion hole penetrating in the vertical direction is provided, and the guide portion may restrain the stopper (support column) from descending when the support column inserted into the insertion hole descends and the shelf is positioned in a lowered position. With this configuration, the support column is guided by the guide portion and is slidable upward. When the shelf is positioned in the lowered position, further descent of the stopper of the support column is restrained by the guide portion, such that the support column is held without falling out.

A lower portion of the support column of the shelf and the base frame may each include mounting holes to horizontally communicate with each other for a fixture to be attached when the shelf is positioned in a raised position. With this configuration, the shelf can be held in the raised position by attaching the fixture. Afterward, the hoist can be removed, and the removed hoist can be used for upward movement (retraction) of other storage racks.

The shelf may include a support column extending in a vertical direction when the shelf is positioned in a lowered position and configured to be foldable when the shelf is positioned in a raised position. With this configuration, the folded support column is not bulky while the shelf is moved upward, and thus the storage rack in the raised position can be made compact.

According to preferred embodiments of the present disclosure, each shelf can be easily retracted upward.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 8 is a diagram illustrating a configuration of support columns near rotation fulcrums in the storage rack in FIG. 7.

FIG. 13 is a diagram illustrating a state in which the shelf is positioned in the raised position in the storage rack in FIG. 11.

DETAILED DESCRIPTION OF THE PREFERRED EMBODIMENTS

Figure 1:
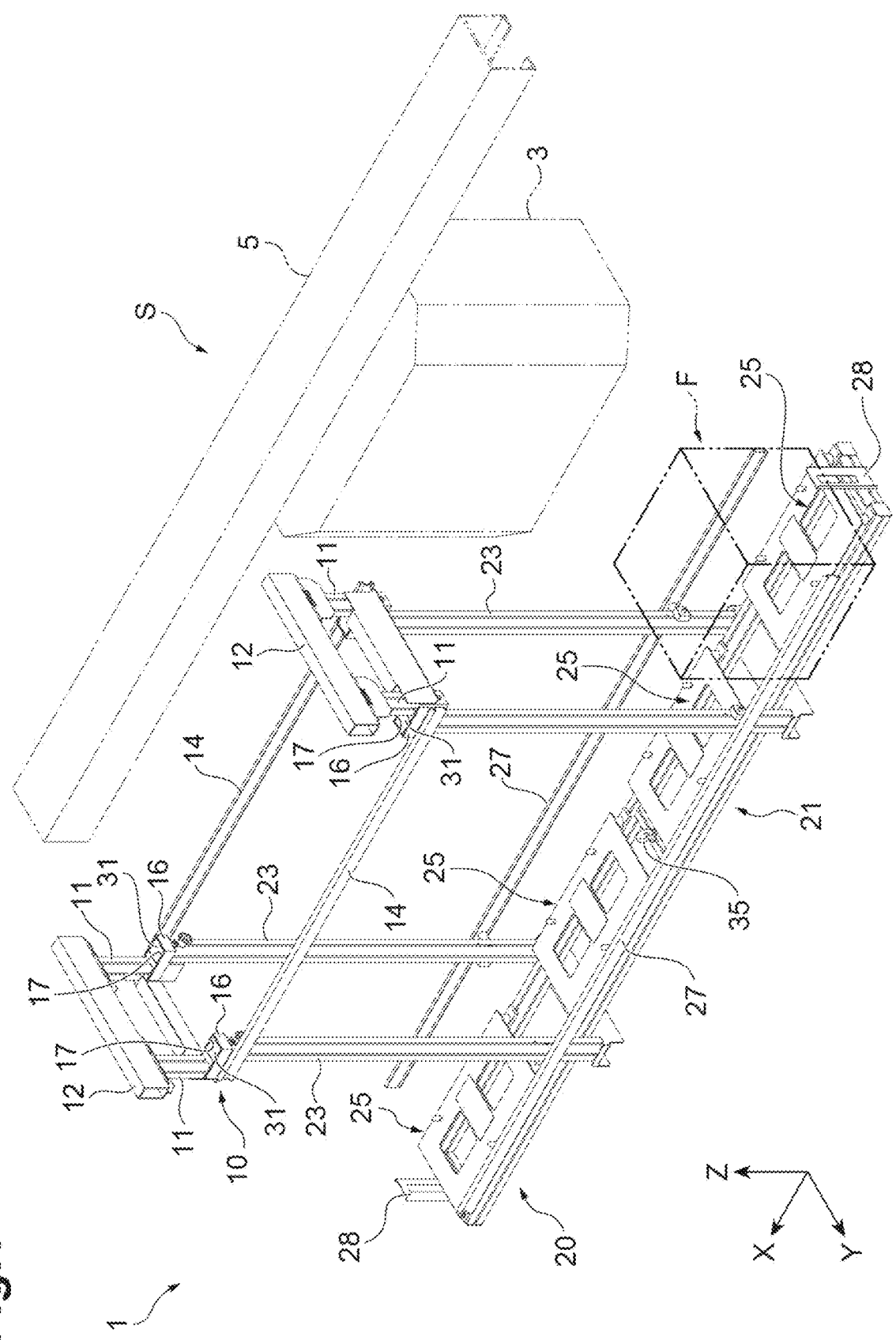
FIG. 1 is a perspective view illustrating a storage rack and an overhead traveling vehicle according to a first preferred embodiment of the present invention.

Preferred embodiments of the present invention will now be described with reference to the drawings. In the description of the drawings, like elements are designated by like reference signs, and duplicate description is omitted. The terms "X-direction", "Y-direction", and "Z-direction" are based on directions illustrated in the drawings and are given for convenience.

As illustrated in FIG. 1, a storage rack 1 according to a first preferred embodiment is disposed along a track 5 for overhead traveling vehicles 3 included in a semiconductor conveyance system S of a semiconductor manufacturing plant, for example. Each overhead traveling vehicle 3 travels along the track 5 extending in the X-direction. The storage rack 1 temporarily stores therein a container F such as a FOUP or a reticle pod. The storage rack 1 is an overhead buffer (OHB). The storage rack 1 is, for example, a side track buffer (STB) including a shelf 20 disposed beside the track 5. In this case, the overhead traveling vehicle 3 transfers a container F in the Y-direction and the Z-direction. The storage rack 1 may be an under track buffer (UTB) including the shelf 20 disposed below the track 5.

Each storage rack 1 includes a base frame 10 suspended from a ceiling, for example, and the shelf 20 attached to the base frame 10 and suspended below the base frame 10. The shelf 20 can store therein a plurality of the containers F, for example. In the example illustrated in FIG. 1, the shelf 20 includes four placement units 25 on each of which a container F can be placed.

In the storage rack 1, the shelf 20 is movable upward with respect to the base frame 10. For example, in a semiconductor plant, a large number of the storage racks 1 may be disposed all over the plant. When semiconductor manufacturing equipment or the like is moved in the plant, in each storage rack 1, the corresponding shelf 20 can be moved upward and retracted to secure a transport path (movement space) for the equipment. If the storage rack does not have such a lifting mechanism, when the equipment is moved, operations are necessary, such as removing the storage rack once, moving it to a temporary storage location, and reinstalling it after the equipment has been moved. However, in the storage rack 1 according to the present preferred embodiment, such removal, reinstallation, and other operations are unnecessary.

Figure 4:
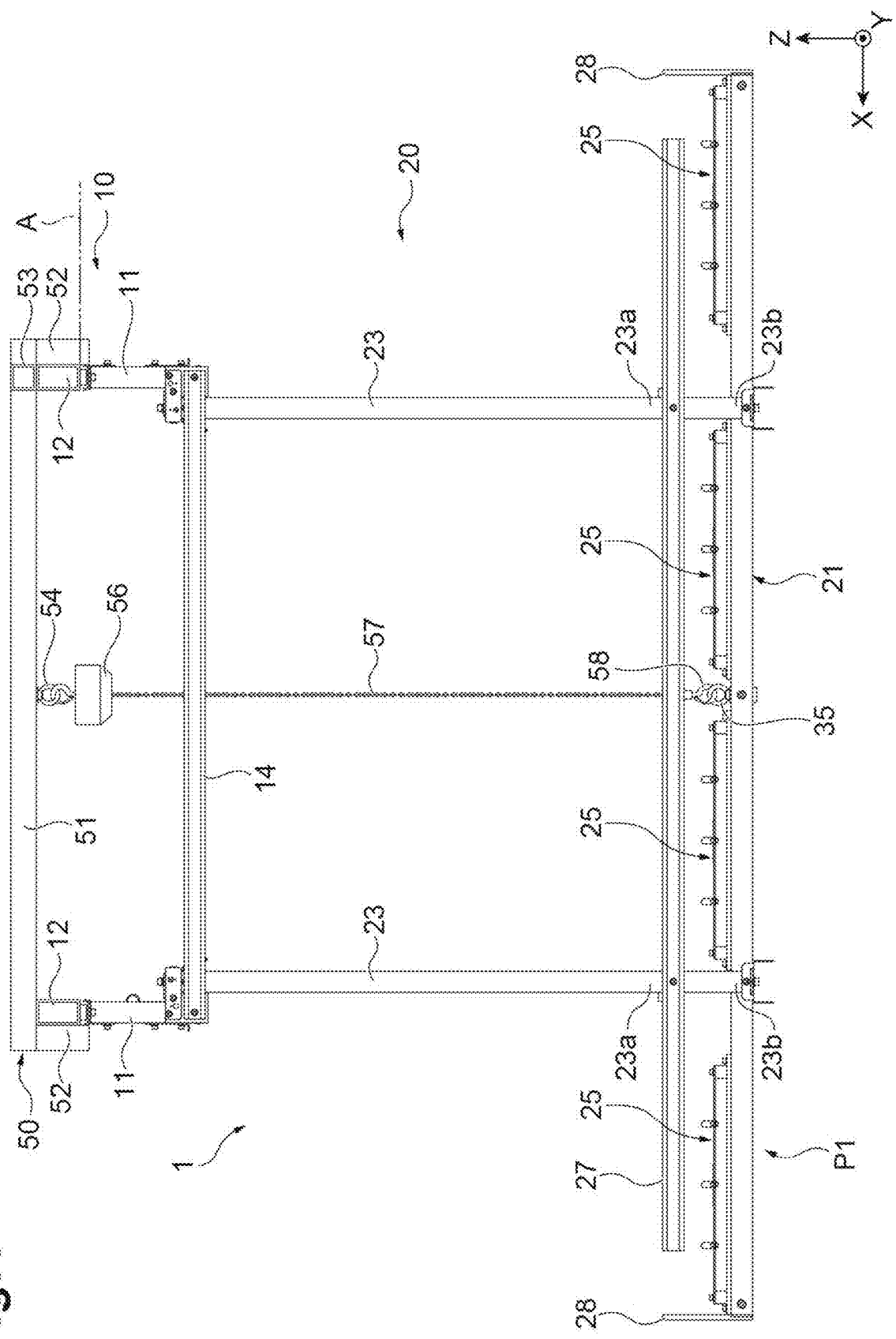
FIG. 4 is a diagram illustrating a state in which a shelf is positioned in a lowered position in the storage rack in FIG. 3.
Figure 5:
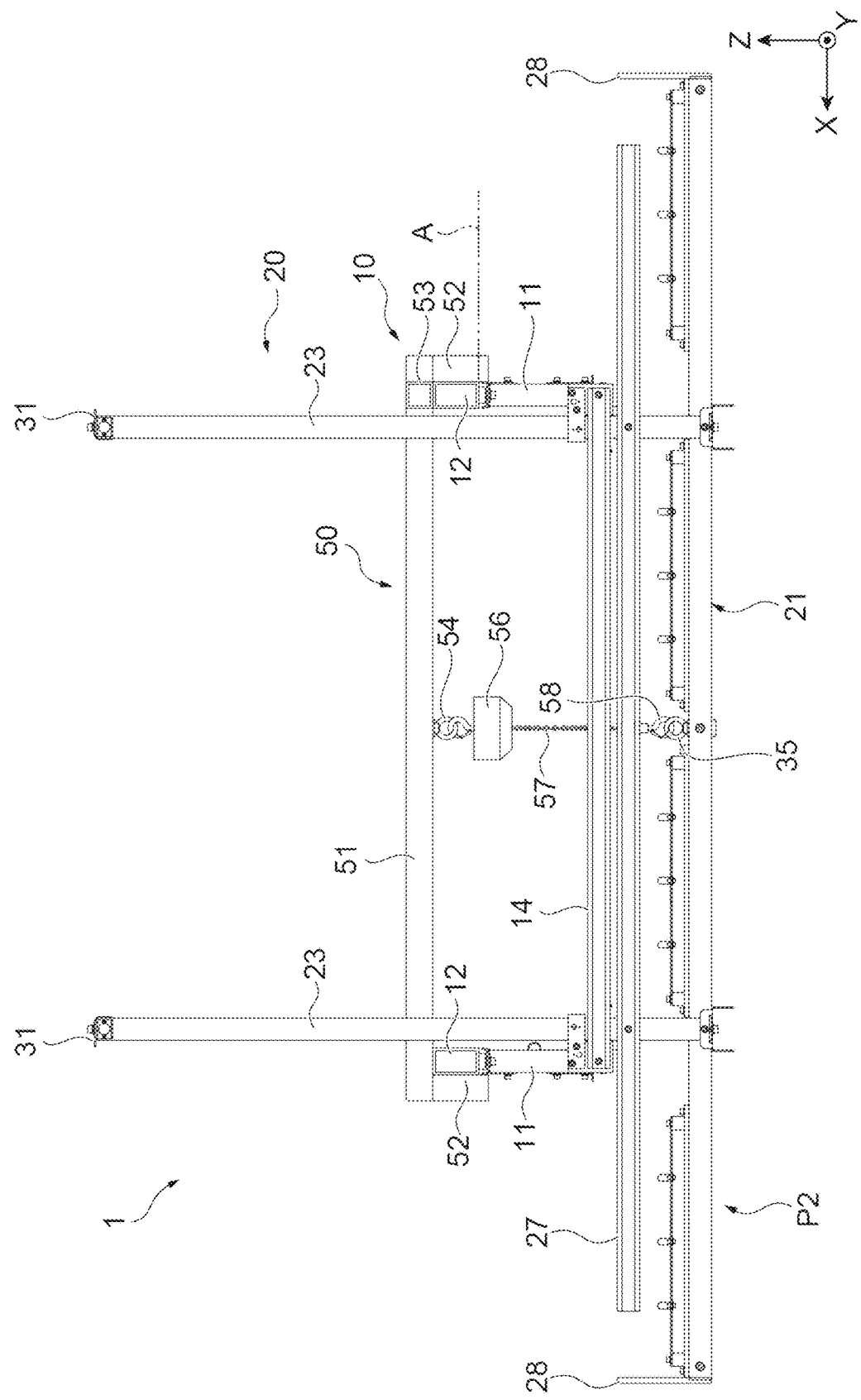
FIG. 5 is a diagram illustrating a state in which the shelf is positioned in a raised position in the storage rack in FIG. 3.

The storage rack 1 has a telescopic (sliding) structure. The shelf 20 slides along the Z-direction (vertical direction) with respect to the base frame 10. In normal use of the storage rack 1, the shelf 20 is positioned in a lowered position P1 (see FIG. 4). This lowered position P1 is the lowest position in the movable range of the shelf 20 in the Z-direction. When the shelf 20 needs to be retracted, the shelf 20 is moved upward and positioned in a raised position P2 (see FIG. 5) by a method described later. In FIGS. 4 and 5, with respect to transverse beams 12 and posts 11, which are components of the base frame 10, transverse-beam mounting surfaces A, where the transverse beams 12 are attached to the posts 11, are indicated by an alternate long and short dash line. These transverse-beam mounting surfaces A are located at a fixed height.

As illustrated in FIG. 1, the base frame 10 includes two pairs of the posts 11 spaced apart in the X-direction and each extending in the Z-direction, two long frames 14 laid over in the X-direction between the two pairs of posts 11, and the transverse beams 12 each laid over in the Y-direction between the upper ends of a corresponding pair of posts 11. Each post 11 is, for example, made of metal and is a rectangular column member with a hollow cross section. Each transverse beam 12 is, for example, a channel steel. In an upper portion of the base frame 10, two transverse beams 12 are spaced apart in the X-direction (horizontal direction).

Each transverse beam 12 has a horizontal placement surface 12a that defines its top surface.

The shelf 20 includes two pairs of support columns 23 spaced apart in the X-direction and each extending in the Z-direction, and a lower frame 21 fixed to lower ends 23b (see FIG. 4) of the two pairs of support columns 23 and defining a plurality of placement units 25. Each support column 23 is, for example, made of metal and is a rectangular column member with a hollow cross section. Between lower portions 23a of the two support columns 23 spaced apart in the X-direction, a fall prevention bar 27 is laid over. At both ends of the lower frame 21 in the X-direction, fall prevention plates 28, 28 are arranged to stand on the lower fame 21. The fall prevention bars 27 and the fall prevention plates 28 are located on the sides and front and back of a container F placed on a placement unit 25 to prevent the container F from falling.

In the storage rack 1, the support columns 23 slide in the vertical direction with respect to the base frame 10 the position of which is fixed. To the base frame 10, guide portions 16 fixed to the lower ends of the respective posts 11 and protruding inward (toward the opposed post 11 spaced apart in the X-direction) are fixed. Each guide portion 16 has a U-shape, and the corresponding post 11 is fit into the opening of the U-shape. Each guide portion 16 includes an insertion hole 17 penetrating in the Z-direction.

The support columns 23 of the shelf 20 are respectively inserted into the insertion holes 17 of the guide portions 16 and are guided so as to slide in the Z-direction, while movement thereof in the X-direction and the Y-direction is restricted by the guide portions 16. When protruding above the guide portions 16, the support columns 23 are located beside the posts 11, and thus do not come into contact with the posts 11. The shelf 20 includes stoppers 31 provided to the upper ends of the respective support columns 23 (see also FIG. 5). Each stopper 31, for example, has a plate-like shape extending horizontally, and the size of the stopper 31 in plan view is larger than the size of each insertion hole 17. The stopper 31 is always located above the corresponding guide portion 16 and cannot pass through the guide portion 16. Thus, when the four support columns 23 inserted into the four insertion holes 17 are lowered and the shelf 20 is positioned in the lowered position P1 (see FIG. 4), the guide portions 16 restrain the stoppers 31 from descending. In this state, for example, the posts 11 and the upper ends of the support columns 23 may be fastened by bolts or other structures or methods. The shelf 20 is held by the base frame 10 without falling out and is fixed in the lowered position P1.

Figure 2:
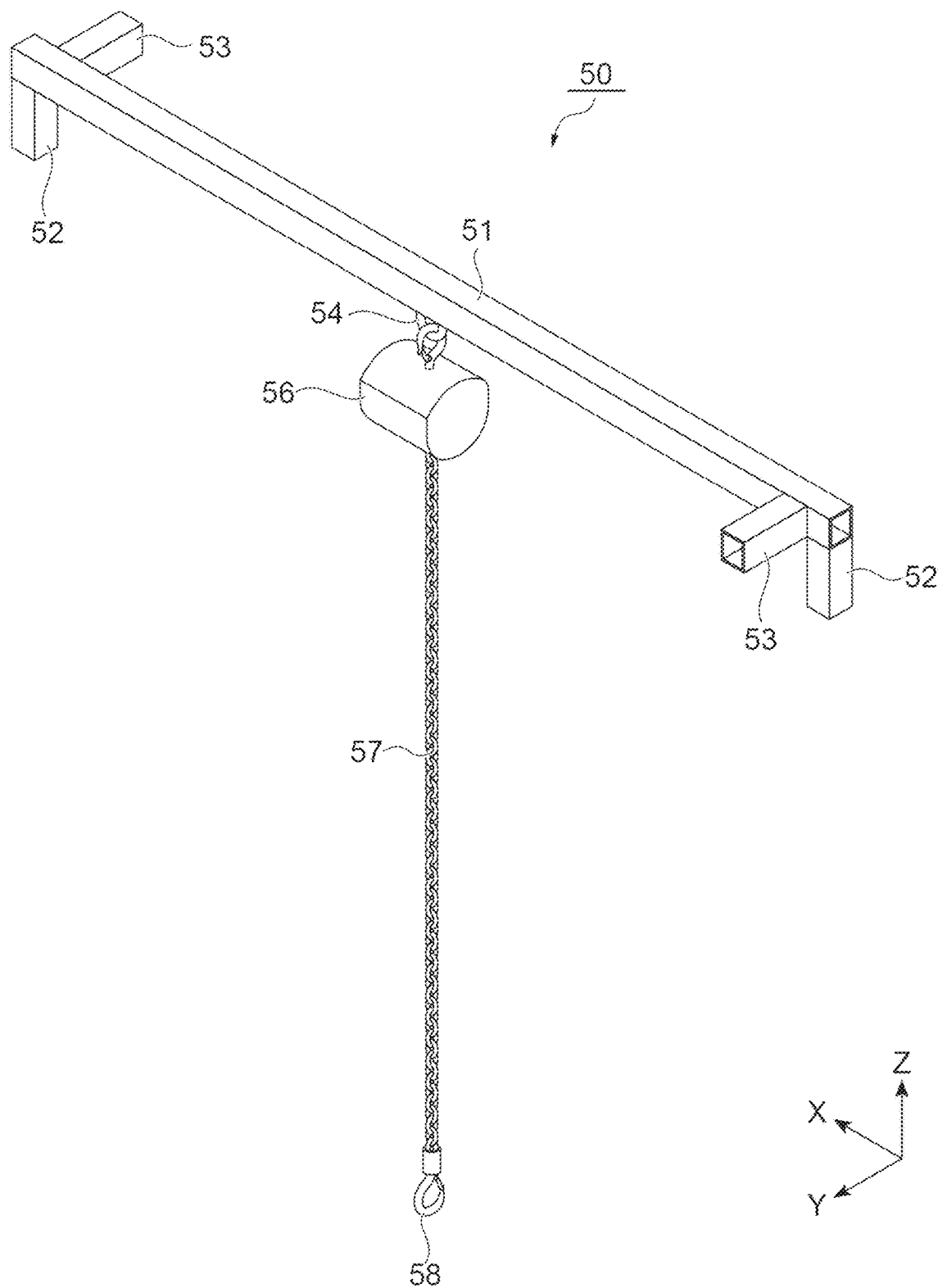
FIG. 2 is a perspective view illustrating a hoisting unit.
Figure 3:
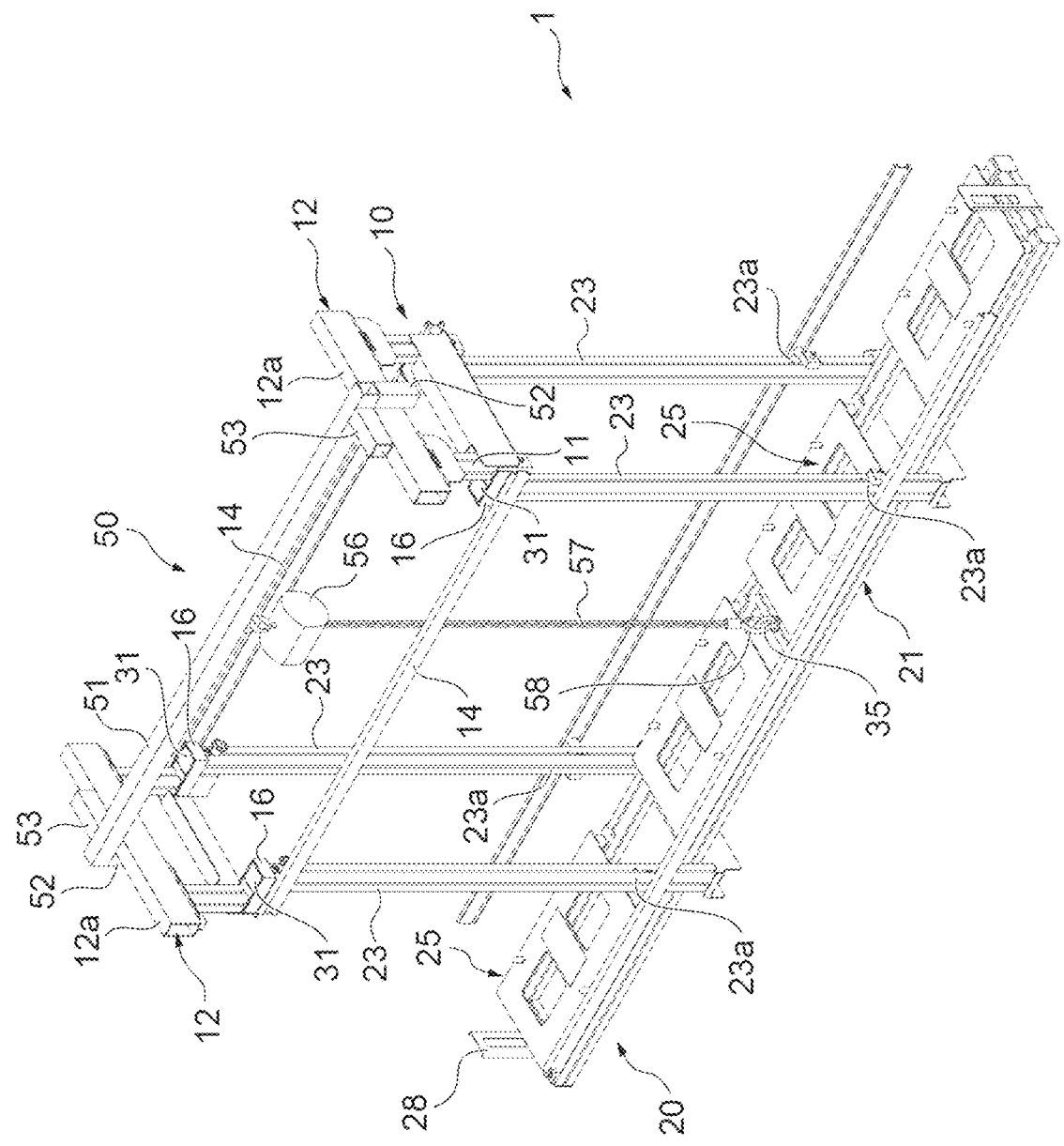
FIG. 3 is a perspective view illustrating a state in which the hoisting unit is placed on the storage rack in FIG. 1.

Referring now to FIGS. 2 through 5, the configuration for moving the shelf 20 upward is described. FIG. 2 is a perspective view illustrating a hoisting unit 50 to be used for the storage rack 1. FIG. 3 is a perspective view illustrating a state in which the hoisting unit 50 is placed on the storage rack 1. The hoisting unit 50 includes a jig capable of being attached to and detached from the storage rack 1. The hoisting unit 50 is placed on the transverse beams 12 of the base frame 10 when the shelf 20 is moved upward or when the shelf 20 is moved downward. The hoisting unit 50 can be placed on the placement surfaces 12a of the transverse beams 12. With this configuration, one hoisting unit 50 can be used for operation to raise and lower shelves 20 for a plurality of the storage racks 1. In other words, it is not necessary for the number of hoisting units 50 to be equal to the number of the storage racks 1. The hoisting unit 50 shared by the storage racks 1 contributes to reducing the overall cost of the facility.

As illustrated in FIG. 2, the hoisting unit 50 includes a main frame 51, vertical members 52 and horizontal members 53 fixed to both ends of the main frame 51, a hoist 56 connected to the main frame 51 with a connecting portion 54 interposed therebetween, a chain 57, and a hook 58. The hoist 56 of the hoisting unit 50 is, for example, an electric chain block. Although not illustrated, the hoist 56 is connected to a power feed cable, for example. The main frame 51, the vertical members 52, and the horizontal members 53 are, for example, made of metal and are rectangular column members with hollow cross sections. The length of the main frame 51 is longer than the length between the outer sides of the two transverse beams 12 spaced apart in the X-direction. The main frame 51 is long enough to be laid over between the two transverse beams 12, and when placed on the placement surfaces 12a, both ends thereof protrude each in the +X-direction and the −X-direction (outward). A pair of the vertical members 52 are attached to these protruding portions. The pair of vertical members 52 extend in the −Z-direction and restrict the X-directional movement of the main frame 51 placed on the transverse beams 12. Inside the mounting positions of the vertical members 52, a pair of the horizontal members 53 are attached, which are laid on the placement surfaces 12a of the transverse beams 12 when the main frame 51 is placed on the placement surfaces 12a. One horizontal member 53 protrudes from the main frame 51 in the +Y-direction, and the other horizontal member 53 protrudes from the main frame 51 in the −Y-direction. The pair of horizontal members 53 restrict the rotational movement (toppling) of the main frame 51, which is placed on the transverse beams 12, about its axis. The positions of the vertical members 52 and the horizontal members 53 in the X-direction may be adjustable.

The connecting portion 54 having an annular shape may be fixed to the center point of the main frame 51 in the X-direction, or may be movable (or attachable) to any position along the main frame 51. In the present preferred embodiment, the connecting portion 54 is movable in consideration of the other types of storage racks 1A and 1B described later. The base of the connecting portion 54 is movable in the X-direction while being engaged with the main frame 51. The connecting portion 54 is fastened at a desired position by a fastening member (not illustrated), for example. The hoist 56 is electric-powered and can wind and lower (pay out) the chain 57. The hoist 56 can be operated remotely, for example. The hoist 56 can be operated by a manual handle.

As illustrated in FIG. 3, the hoisting unit 50 is carried to an installation site of the storage rack 1 the shelf 20 of which needs to be retracted, and is placed on the placement surface 12a of the transverse beam 12 thereof. An operator can access the storage rack 1 by using a scaffolding unit (not illustrated), for example, installed beside the storage rack 1. When placing the hoisting unit 50, the operator first causes one transverse beam 12 to support one end of the main frame 51 by hooking the corresponding vertical member 52 to the outside of the transverse beam 12, and then causes the other transverse beam 12 to support the other end of the main frame 51. The main frame 51 that is a rectangular column member sits in a stable position on the transverse beams 12. The main frame 51 is placed in substantially the center of each transverse beam 12 in the Y-direction. The vertical members 52 and the horizontal members 53 restrict the movement of the main frame 51. The hoisting unit 50 is positioned in the X-direction and the Y-direction when the hoisting unit 50 is simply laid over between the transverse beams 12. In the Z-direction as well, the hoisting unit 50 is held down on the transverse beams 12 by engagement with an engaged portion 35 described later, and the position of the hoisting unit 50 is fixed. In this case, no particular fixture is needed.

To the center of the lower frame 21 in the X-direction and the Y-direction, the engaged portion 35 with an eyebolt, for example, is attached. The engaged portion 35 is fixed, for example, at the center of gravity in the shelf 20 on which a container F is not placed. The operator engages the engaged portion 35 with the hook 58. As illustrated in FIG. 4, the hoist 56 is suspended from the connecting portion 54 fixed to the center point of the main frame 51 in the X-direction, and thus the chain 57 hangs vertically (in the Z-direction). The main frame 51 can move freely because only upward movement thereof is not restricted by the vertical members 52 and the horizontal members 53. However, when the engaged portion 35 is engaged with the hook 58 and tension is applied to the chain 57, the empty weight of the shelf 20 is applied to the main frame 51. Thus, a downward load is applied to the main frame 51, and the position of the main frame 51 is stabilized. The main frame 51 is aligned so as to pull up the shelf 20 at substantially at the center of gravity thereof.

Figure 6A:
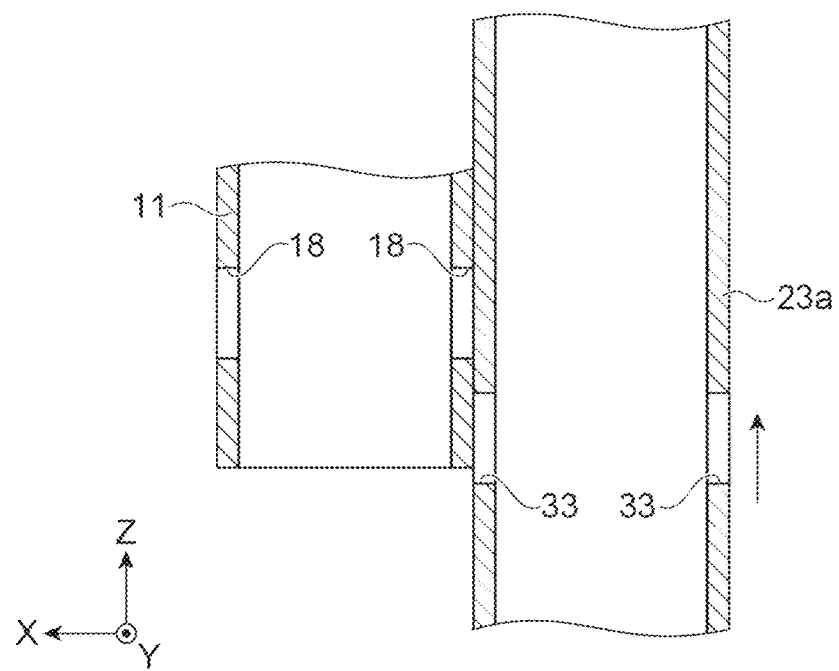
FIG. 6A is a diagram illustrating a state in which a support column moves upward with respect to a base frame.
Figure 6B:
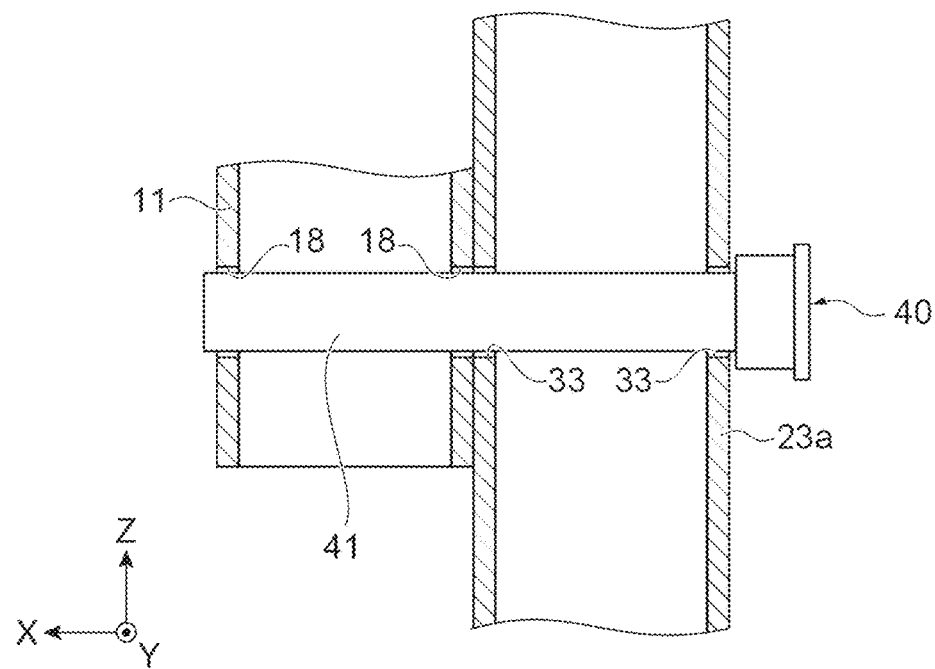
FIG. 6B is a diagram illustrating a state in which a fixture is inserted into two mounting holes that communicate with each other.
Figure 7:
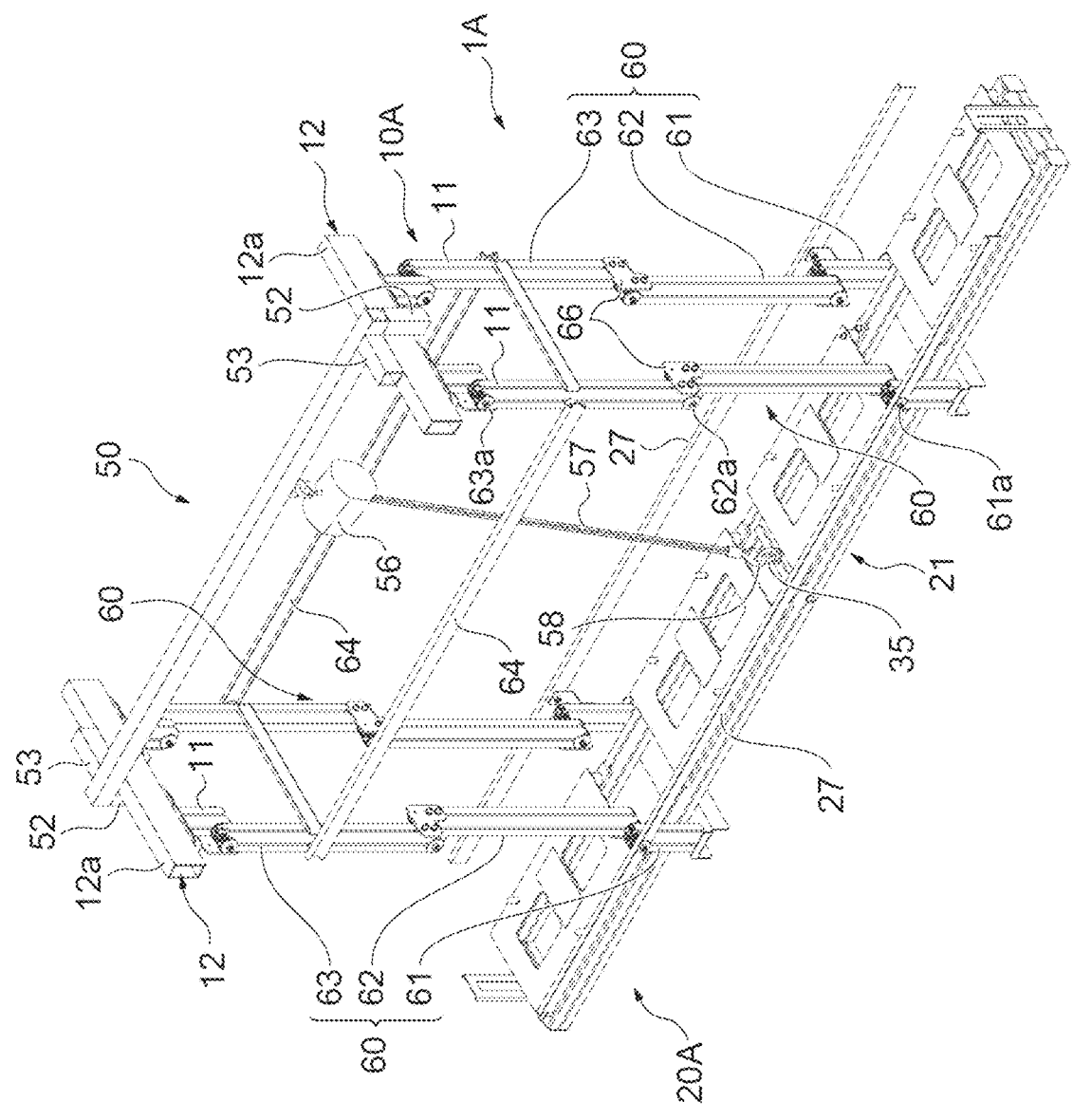
FIG. 7 is a perspective view illustrating a state in which the hoisting unit is placed on a storage rack according to a second preferred embodiment of the present invention.

Subsequently, when the chain 57 is wound by the hoist 56, the shelf 20 is moved upward with respect to the base frame 10, as illustrated in FIG. 5. The movement of the shelf 20 is stopped when or just before the fall prevention bars 27 come into contact with the long frames 14 of the base frame 10. As illustrated in FIGS. 6A and 6B, for example, in the lower portion 23a of each support column 23 and the corresponding post 11, first mounting holes 33 and second mounting holes 18 are provided, respectively, which communicate with each other in the X-direction (horizontal direction) when the shelf 20 is positioned in the raised position P2. At the time when the two first mounting holes 33 of the support column 23 and the two second mounting holes 18 of the post 11 have been aligned horizontally, a separate fixing pin 40 is prepared and its rod-shaped portion 41 is inserted into the first mounting holes 33 and the second mounting holes 18 (see FIG. 6B). The fixing pin 40 is a fixture, and the first mounting holes 33 and the second mounting holes 18 are mounting holes for the fixture to be attached. The fixing pin 40 has a lock mechanism, for example, having a structure that cannot be easily removed once it has been inserted into the first mounting holes 33 and the second mounting holes 18. The fixing pins 40 support the weight of the shelf 20 positioned in the raised position P2.

With the storage rack 1 according to the present preferred embodiment, the shelf 20 can be moved upward by placing the hoisting unit 50, which is prepared separately from the storage rack 1, on the base frame 10 and engaging the engaged portion 35 with the hook 58 and winding the chain 57. The storage rack 1 does not include the hoisting unit 50, and thus the configuration thereof can be simplified more than a conventional one. A hoisting operation (retracting operation) itself is also simple, and thus the shelf 20 can be easily retracted upward. It should be noted that, in the storage rack 1, when the shelf 20 is positioned in the raised position P2, the support columns 23 protrude significantly above the transverse-beam mounting surfaces A. The support columns 23 protrudes by most (or half or more) of the total length thereof from the transverse-beam mounting surfaces A, and thus the storage rack 1 should be used in situations in which sufficient clearance above the base frame 10 is available.

The base frame 10 includes the transverse beams 12 spaced apart in the X-direction and including the placement surfaces 12a on which the hoisting unit 50 is to be placed. Preparation for hoisting is completed simply by placing the hoisting unit 50 on the placement surfaces 12a of the transverse beams 12 and engaging the engaged portion 35 with the hook 58, and thus the hoisting operation is further facilitated.

The guide portions 16 of the base frame 10 restrain the stoppers 31 from further descending when the support columns 23 inserted into the insertion holes 17 descend and the shelf 20 is positioned in the lowered position P1. The support columns 23 are guided by the guide portions 16 and are slidable up and down. When the shelf 20 is positioned in the lowered position P1, the stoppers 31 of the support columns 23 are restrained by the guide portions 16, whereby the support columns 23 are held without falling out.

The lower portion 23a of each support column 23 and the base frame 10 have the first mounting holes 33 and the second mounting holes 18, respectively, configured to horizontally communicate with each other for the fixture to be attached when the shelf 20 is positioned in the raised position P2. By attaching the fixing pins 40 to the base frame 10 and shelf 20, the shelf 20 can be held in the raised position P2. Thus, in this state, the hoisting unit 50 can be removed, and the hoisting unit 50 can be used for upward movement (retraction) of other storage racks 1.

Referring now to FIGS. 7 through 10, the storage rack 1A according to a second preferred embodiment is described. The storage rack 1A illustrated in FIG. 7 differs from the storage rack 1 according to the previous preferred embodiment illustrated FIG. 3 in that instead of the base frame 10 including the long frames 14, a base frame 10A is provided, in which the long frames 14 are omitted and four posts 11 are rotatably connected to the shelf 20 with upper rotation fulcrums 63a interposed therebetween, and instead of the shelf 20 including the slide-type (telescopic) support columns 23, a shelf 20A including four foldable support columns 60 is provided. In the base frame 10A, the posts 11 and the transverse beams 12 may have the same configurations as those of the posts 11 and the transverse beams 12 in the base frame 10. In the shelf 20A, four reinforcing plates 64 are laid over between four upper column members 63. The four reinforcing plates 64 are attached at the same height and are rectangular, which reinforce the shelf 20A by defining the spacing between the upper column members 63.

Each support column 60 of the shelf 20A includes a lower column member 61 fixed to the lower frame 21 and standing up in the Z-direction, a middle column member 62 the lower end of which is connected to the upper end of the lower column member 61 with a lower rotation fulcrum 61a interposed therebetween, and the corresponding upper column member 63 the lower end of which is connected to the upper end of the middle column member 62 with a middle rotation fulcrum 62a interposed therebetween. The lower column member 61, the middle column member 62, and the upper column members 63 are, for example, made of metal and are rectangular column members with hollow cross sections. The upper end of the upper column member 63 is connected to the lower end of the post 11 with the corresponding upper rotation fulcrum 63a. FIG. 8 is a diagram illustrating a configuration of the support columns 60 near the middle rotation fulcrums 62a. As illustrated in FIG. 8, each middle rotation fulcrum 62a has a rotation axis L extending in the Y-direction. Each lower rotation fulcrum 61a and each upper rotation fulcrum 63a also have a rotation axis L extending in the Y-direction. About these three parallel rotation fulcrums, two connected column members rotate relative to each other. The length of the middle column member 62 is the same as the length of the upper column member 63. The fall prevention bars 27 are connected to the support columns 60 at the lower rotation fulcrums 61a.

Figure 9:
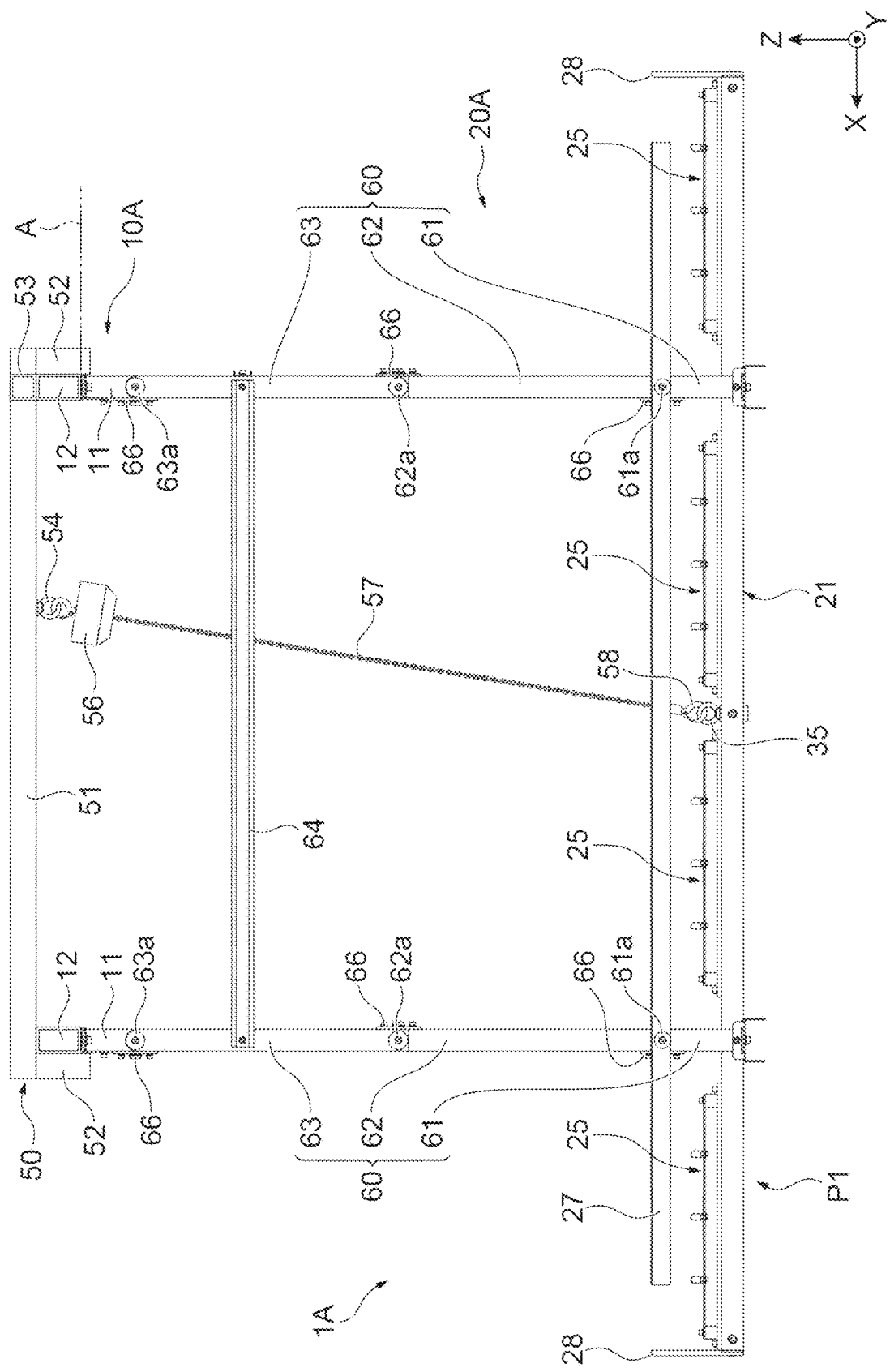
FIG. 9 is a diagram illustrating a state in which a shelf is positioned in the lowered position in the storage rack in FIG. 7.

When the shelf 20 is positioned in the lowered position P1, as illustrated in FIGS. 8 and 9, each middle column member 62 is fixed to the corresponding upper column member 63 by upper fixing bolts 68 and lower fixing bolts 67 oriented in the X-direction with a flat fixing plate 66, lying astride both members, interposed therebetween. Similar fixing structures are provided between the corresponding lower column member 61 and the middle column member 62, and between the upper column member 63 and the corresponding post 11. When the shelf 20 is moved upward, in order to allow relative rotation of the two connected column members, the fixing bolts to either one of these column members are removed and unfastened. As illustrated in FIG. 9, the fixing plates 66 at the middle rotation fulcrums 62a are attached to sides on the −X side, while the fixing plates 66 at the lower rotation fulcrums 61a and the upper rotation fulcrums 63a are attached to sides on the +X side. This allows any of the four support columns 60 to bend (be folded) in the same direction. For example, portions of the middle rotation fulcrums 62a are rotated so as to protrude to the right illustrated in FIG. 9.

Figure 10:
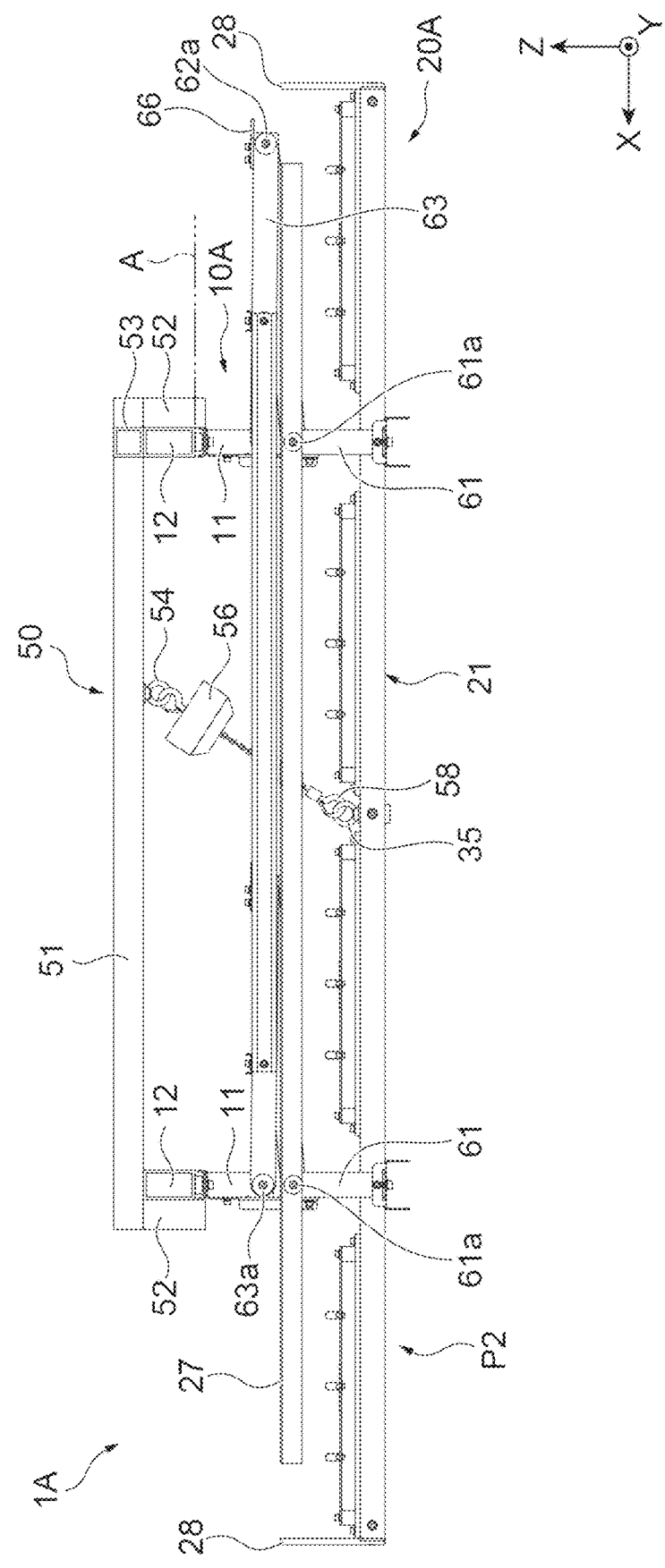
FIG. 10 is a diagram illustrating a state in which the shelf is positioned in the raised position in the storage rack in FIG. 7.

When hoisting operation is performed on the shelf 20A, the connecting portion 54 is fixed, for example, at a position shifted to the −X side from the center point of the main frame 51 in the X-direction as illustrated in FIG. 9. In other words, the connecting portion 54 is displaced from the center point in the X-direction to the side where the portions of the middle rotation fulcrums 62a protrude, and is fixed at an appropriate position. Thus, the chain 57 hangs down in a direction that defines an angle (inclined direction) with respect to the vertical direction (Z-direction). When the chain 57 is wound by the hoist 56, at each rotation fulcrum, an impetus for rotation is provided (a force is applied in the direction of rotating) and each support column 60 is folded. As illustrated in FIG. 10, the shelf 20A is then moved upward with respect to the base frame 10A. When the upper column members 63 have come into contact with the lower column members 61 and the middle column members 62 have come into contact with the posts 11, the movement of the shelf 20 is stopped. The portions of the middle rotation fulcrums 62a that protrude as a result of being folded fit inside an end of the lower frame 21 in the X-direction. In a state in which the shelf 20A has moved upward to be positioned in the raised position P2 and each support column 60 has been folded, portions of the corresponding lower rotation fulcrum 61a and the corresponding upper rotation fulcrum 63a, that is, the upper end of the corresponding lower column member 61 and the lower end of the corresponding post 11 may be joined together by a single fixing plate (flat plate member) and fixed to each other. Thus, in this state, the hoisting unit 50 can be removed, and the hoisting unit 50 can be used for upward movement (retraction) of other storage racks 1A. The shelf 20A moves upward following a straight trajectory in the Z-direction because the length of the middle column member 62 and that of the upper column member 63 are the same. The reinforcing plates 64 and the fall prevention bars 27 do not obstruct the movement of their respective column members during this upward movement process, and thus the reinforcing plates 64 and the fall prevention bars 27 do not have to be removed.

The storage rack 1A according to the second preferred embodiment also provides the same actions and effects as those of the storage rack 1. The storage rack 1A does not include the hoisting unit 50, and thus the configuration thereof can be simplified more than a conventional one. A hoisting operation (retracting operation) itself is also simple, and thus the shelf 20 can be easily retracted upward.

The support columns 60 folded with a pantograph structure is not bulky while the shelf 20A is moved upward, and thus the storage rack 1A in the raised position P2 can be made compact. As in the storage rack 1, the support columns 23 do not protrude above the transverse-beam mounting surfaces A in the raised position P2, and the shelf 20A sits below the transverse-beam mounting surfaces A. The portions of the middle rotation fulcrums 62a that protrude fit inside the end of the lower frame 21 in the X-direction, and thus the storage rack 1A is advantageous in terms of footprint. For example, even if a plurality of the storage racks 1A are positioned with small spaces therebetween in the X-direction, the storage racks 1A can be prevented from coming into contact with each other when being folded.

Figure 11:
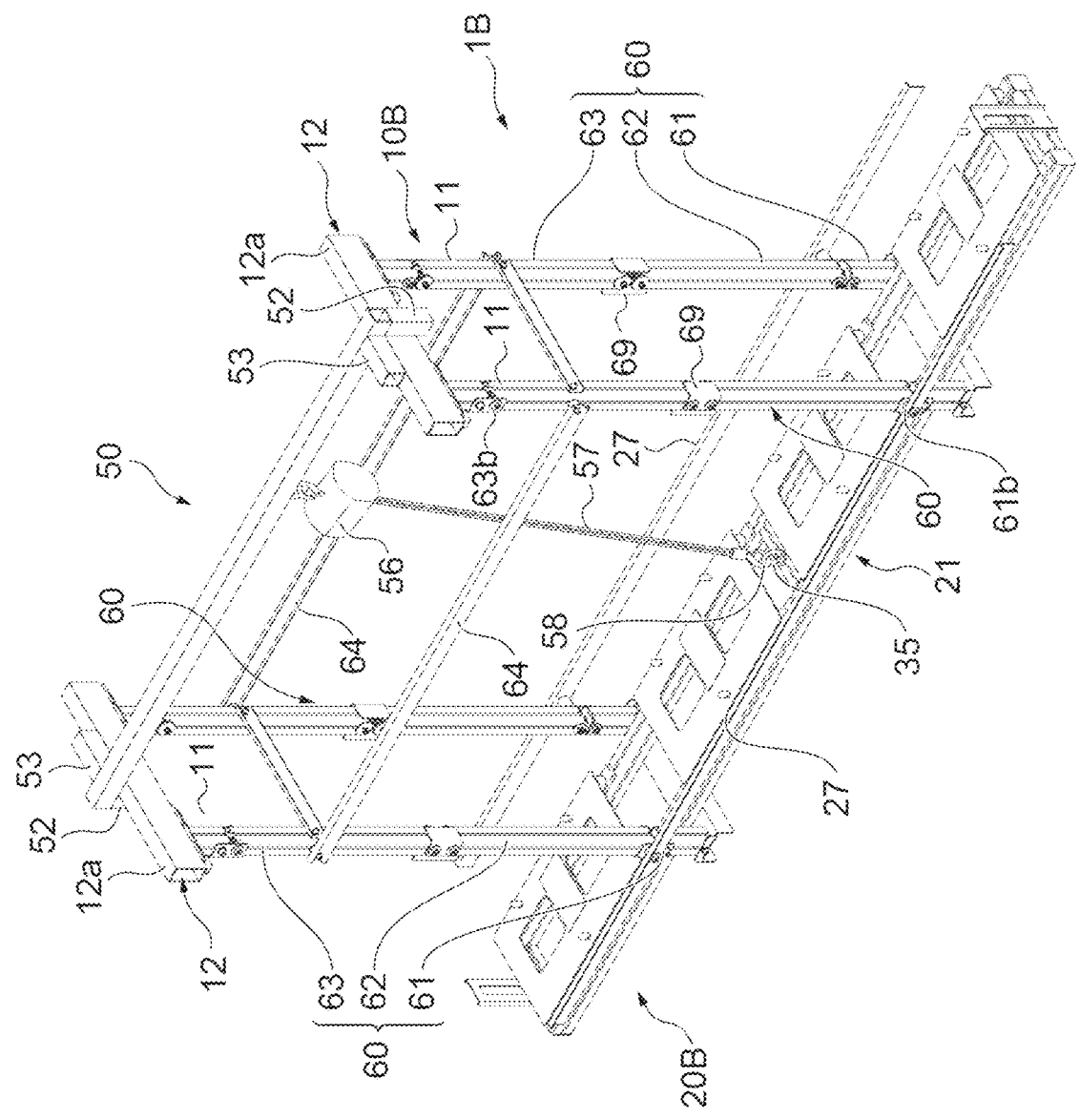
FIG. 11 is a perspective view illustrating a state in which the hoisting unit is placed on the storage rack according to a modification of the second preferred embodiment of the present invention.
Figure 12:
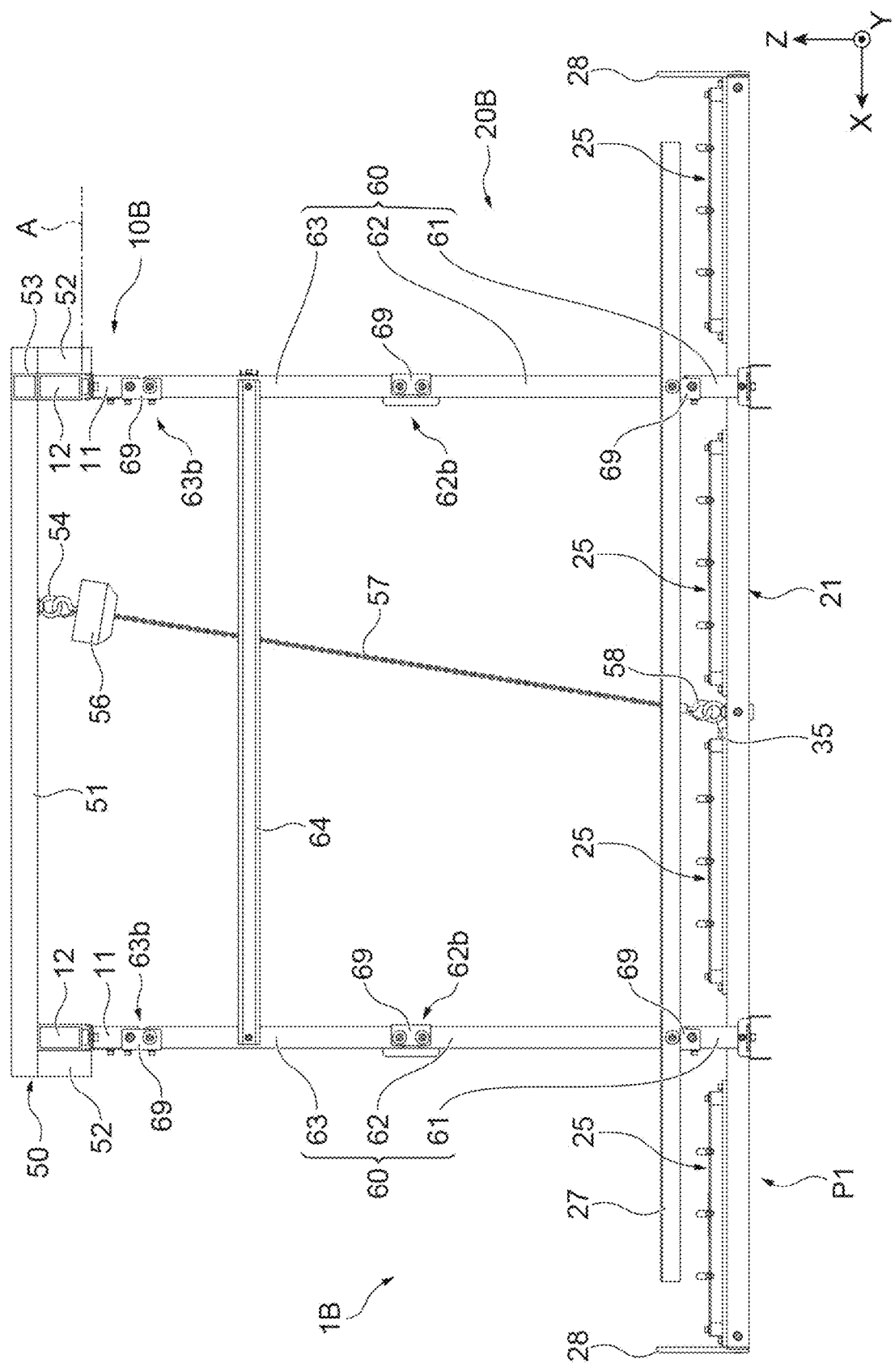
FIG. 12 is a diagram illustrating a state in which the shelf is positioned in the lowered position in the storage rack in FIG. 11.

Referring now to FIGS. 11 through 13, the storage rack 1B according to a modification of the second preferred embodiment is described. The storage rack 1B shown in FIG. 11 differs from the storage rack 1A according to the previous preferred embodiment illustrated in FIG. 7 in that instead of the shelf 20A in which the respective column members are connected with rotation fulcrums, each having one rotation axis L, interposed therebetween, a shelf 20B is provided, in which each lower column member 61 and the corresponding middle column member 62, the middle column member 62 and the corresponding upper column member 63, and the upper column member 63 and the corresponding post 11 (of a base frame 10B) are connected together, with a lower rotation fulcrum 61b, a middle rotation fulcrum 62b, and an upper rotation fulcrum 63b, each having two rotation axes, interposed therebetween. As illustrated in FIG. 12, at the lower rotation fulcrums 61b, the middle rotation fulcrums 62b, and the upper rotation fulcrums 63b, connecting plates 69 with U-shaped cross sections are attached instead of the fixing plates 66 of the shelf 20A. The fixing bolts are oriented in the Y-direction and parallel to the rotation axes, unlike in the case of the fixing plate 66. With the connecting plates 69 and this connecting structure, the fixing bolts do not have to be removed when the middle column members 62 and the upper column members 63 are folded. In the storage rack 1B also, in a state in which the support columns 60 have been folded, the above-described fixation by the fixing plates (flat plate members) may be performed.

The storage rack 1B according to the modification also provides the same actions and effects as those of the storage rack 1A. The storage rack 1B does not include the hoisting unit 50, and thus the configuration thereof can be simplified more than a conventional one. A hoisting operation (retracting operation) itself is also simple, and thus the shelf 20 can be easily retracted upward. The portions of the middle rotation fulcrums 62b that protrude fit inside the end of the lower frame 21 in the X-direction, and thus the storage rack 1B is advantageous in terms of footprint. In the shelf 20B, each rotation fulcrum has two rotation axes, and thus the length of each support column 60 illustrated in FIG. 12 in the Z-direction is greater than that in the shelf 20A when the lifting height of the shelf 20 is considered constant. In situations in which restrictions in the Z-direction are not severe, the storage rack 1B is more advantageous because the fixing bolts do not have to be removed.

Although the preferred embodiments of the present disclosure are described above, the present invention is not limited to the above preferred embodiments. For example, the hoisting unit 50 may be placed on a portion of the base frame 10, which is different from the transverse beams 12. The configuration of the base frame 10 may be modified as appropriate. The planar arrangement of the support columns in the shelf may also be modified as appropriate.

The fixing structure when the shelf is positioned in the raised position P2 is not limited to those in the above-described preferred embodiments.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A storage rack comprising:
   a base frame; and
   a shelf movable upward with respect to the base frame; wherein
   a hoist attachable to and detachable from the base frame and placeable on the base frame;
   the shelf includes an engaged portion engageable with a hook of the hoist;
   the shelf includes a support column extending in a vertical direction;
   the support column includes a stopper at an upper end;
   the base frame includes a guide portion including an insertion hole penetrating in a vertical direction;
   the guide portion restrains the stopper from descending when the support column inserted into the insertion hole descends and the shelf is positioned in a lowered position; and
   a lower portion of the support column of the shelf and the base frame each include mounting holes to horizontally communicate with each other for a fixture to be attached when the shelf is positioned in a raised position.

2. The storage rack according to claim 1, wherein the base frame includes transverse beams horizontally spaced apart and each including a placement surface on which the hoist is to be placed.

* * * * *